United States Patent
Atura Bushnell et al.

(10) Patent No.: US 12,026,342 B2
(45) Date of Patent: Jul. 2, 2024

(54) USING A STRUCTURAL INTERNAL ELEMENT AS A CAPACITIVE ELEMENT TO SENSE PROXIMITY

(71) Applicant: Apple Inc., Cupertino, CA (US)

(72) Inventors: Tyler S. Atura Bushnell, San Francisco, CA (US); Andreas J. Koeberl, San Francisco, CA (US); Eric S. Winokur, San Francisco, CA (US); Matthew J. Schwendeman, San Francisco, CA (US); Timothy M. Johnson, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/446,394

(22) Filed: Aug. 30, 2021

(65) Prior Publication Data

US 2023/0062180 A1 Mar. 2, 2023

(51) Int. Cl.
*G06F 3/044* (2006.01)
*H03K 17/955* (2006.01)
*H03K 17/96* (2006.01)

(52) U.S. Cl.
CPC ........... *G06F 3/044* (2013.01); *H03K 17/955* (2013.01); *H03K 2017/9613* (2013.01)

(58) Field of Classification Search
CPC .................. G06F 3/044; H03K 17/955; H03K 2017/9613

USPC .................................................. 345/173–174
See application file for complete search history.

(56) References Cited

U.S. PATENT DOCUMENTS

| | | | |
|---|---|---|---|
| 2014/0139454 A1* | 5/2014 | Mistry | G06F 3/017 345/173 |
| 2014/0213323 A1* | 7/2014 | Holenarsipur | G06F 1/169 455/566 |
| 2017/0090599 A1* | 3/2017 | Kuboyama | H03K 17/962 |
| 2019/0305237 A1* | 10/2019 | Shin | H01L 27/323 |
| 2019/0339784 A1* | 11/2019 | Lemay | G06F 1/3206 |
| 2020/0050829 A1* | 2/2020 | Akcasu | G06V 40/1365 |

* cited by examiner

*Primary Examiner* — Kwin Xie
(74) *Attorney, Agent, or Firm* — Dorsey & Whitney LLP

(57) ABSTRACT

An electronic device can include a housing, a back cover, a structural member, and a sensing circuit. The housing can at least partially define an internal volume of the electronic device and the back cover can define at least a portion of the internal volume and be connected to the housing. The structural member can be disposed against the back cover and at least partially within the internal volume, the structural member including an electronic component. The sensing circuit can be disposed in the internal volume and electrically coupled to the electronic component. The sensing circuit can detect an amount of charge of the electronic component as part of a user proximity sensor of the electronic device.

8 Claims, 16 Drawing Sheets

USING A STRUCTURAL INTERNAL ELEMENT AS A CAPACITIVE ELEMENT TO SENSE PROXIMITY

FIELD

The present disclosure relates generally to electronic devices. More particularly, the present disclosure relates to proximity sensing apparatus, systems, and methods that can be incorporated into one or more electronic devices.

BACKGROUND

Recent advances in portable computing have enabled electronic devices that are worn on, and interface with, the body of the user. Many functionalities, including body sensing functionalities and other feedback systems, interne connectivity, cellular data capabilities, and other convenient functionalities have recently been incorporated into such wearable devices.

Wearable devices are generally designed to be compact in form and lightweight so as not to burden the user. The user's preference for compact and lightweight wearable devices, which include the various components needed to perform the multiple functions of the device, drives the need to further develop wearable electronic devices that are more compact, even as the number of functions and components within such devices increases.

Furthermore, the portable nature of wearable electronic devices can expose some of the components, such as sensors and antennas, to a variety of environments, which may vary in ambient lighting conditions, temperature, movement of the device, and so forth. Therefore, what is also needed are devices, systems, and methods for ensuring that such sensors and other components are durable, effective, and reliable for use in a variety of environments.

SUMMARY

The present disclosure relates generally to electronic devices. More particularly, the present disclosure relates to proximity sensing apparatus, systems, and methods that can be incorporated into one or more electronic devices. In one example, the present disclosure includes an electronic device that includes a housing, a back cover, a structural member, and a circuit. The housing can at least partially define an internal volume of the electronic device, and the back cover can define at least a portion of the internal volume and be connected to the housing. The structural member can be disposed against the back cover and at least partially within the internal volume, the structural member including an electronic component. The circuit can be disposed in the internal volume and can be electrically coupled to the electronic component, the circuit detecting an amount of charge of the electronic component.

In at least one example, such an electronic device can also include a processor disposed within the internal volume. The processor can be configured to determine a presence of an object at or near the back cover based at least partially on the amount of charge at the structural member. In one example, the amount of charge passes a charge threshold when a distance between the structural member and the object is 30 mm or less.

In one example, the structural member is electrically isolated from the housing. The electronic component can also include an electrically conductive material.

In at least one example, the electronic device includes first and second electronic components with first and second electrical charges, respectively, with the electronic components being isolated from one another. A circuit can be disposed in the internal volume of the electronic device, which is electronically coupled to the electronic components, to detect the amount of charge on the first and second electronic components separately.

In at least one example of the present disclosure, the back cover can define a back cover aperture, and the structural member can define a structural member aperture. The back cover aperture and the structural member aperture can be at least partially aligned.

Another example of an electronic device of the present disclosure includes a housing at least partially defining an internal volume, a back cover connected to the housing, a securement feature configured to hold the back cover against or near a user during use, and a user proximity sensor that includes an electrically charged electronic component. The user proximity sensor can be configured to sense when the back cover is at or near the user during use.

Such an electronic device can also include, for example, a front cover connected to the housing, where the front cover at least partially defines an exterior front surface of the device, where the back cover at least partially defines an exterior back surface of the device disposed opposite the exterior front surface, and the user proximity sensor includes a structural member disposed at least partially within the interior volume and at least partially against the back cover. In such an example, the structural can absorb forces acting on the back cover during use.

At least one example of the electronic component includes an electrically conductive material and the structural member can include the charged electronic component. The structural member can also include a lower surface with a first contour, and the back cover can include a top surface with a second contour. The first contour and the second contour can form an area of contact between the structural member and the back cover.

In at least one example, the user proximity sensor can also include a sensing circuit electronically coupled to the charged electronic component and a processor coupled to the sensing circuit. The processor can be configured to sense a change in an electric charge of the charged electronic component.

Another example of an electronic device of the present disclosure includes a housing at least partially defining an internal volume, an electronic component disposed at least partially within the internal volume, a sensing circuit disposed within the internal volume, the sensing circuit coupled to the electronic component, and a processor disposed in the internal volume. The processor can be configured to alternate the electronic component and the sensing circuit between a first sensor and a second sensor, where the first sensor includes a capacitive proximity sensor.

In one example, the processor is configured to determine a presence of an object at or near the housing based at least partially on the electrical charge of the electronic component.

In one example, the electronic device is a smart watch, the object is a user's body, and the smart watch includes a securement device configured to secure the smart watch to the user's body.

In at least one example, the electronic component defines a break extending from a periphery of the electronic component to an aperture defined by the electronic component, and the second sensor is an antenna. In at least one example, the back cover can be connected to the housing, and a structural member can include the electronic component. In such an example, the structural member can be configured to add structural strength to the back cover.

Additional features and advantages of examples given in the present disclosure will be set forth in the description which follows, and in part will be obvious from the description, or may be learned by the practice of such examples. The features and advantages of such examples may be realized and obtained by means of the instruments and combinations particularly pointed out in the appended claims. These and other features will become more fully apparent from the following description and appended claims or may be learned by the practice of such examples as set forth hereinafter.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
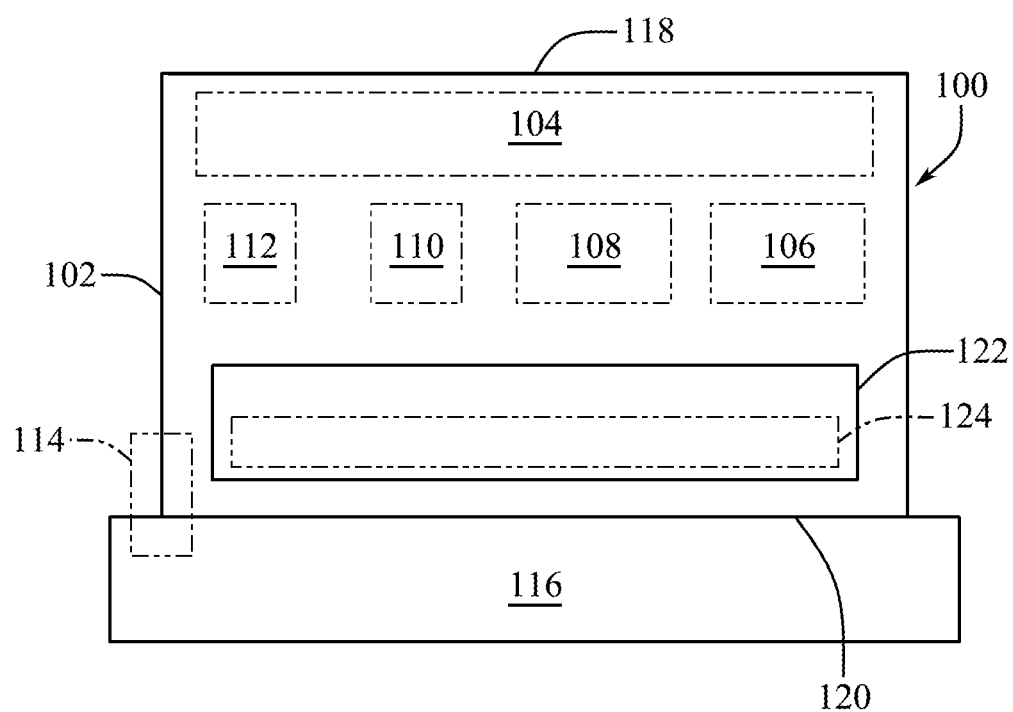
FIG. 1 shows a schematic view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The present disclosure relates generally to electronic devices. More particularly, the present disclosure relates to proximity sensing apparatus, systems, and methods that can be incorporated into one or more electronic devices. One aspect provides a wearable electronic device that can be secured against the body of a user. The electronic device can include a capacitive proximity sensor disposed within the device that senses when the user puts the device on and/or takes the device off. In at least one example, the capacitive proximity sensor can be disposed at or near a back cover of the electronic device, such that the sensor can detect when back cover is pressed against the body of the user, such as when the device is worn.

Capacitive proximity sensors require minimal power to operate and are not affected by ambient light conditions. The various examples and configurations of capacitive proximity sensors described herein can overcome various inherent limitations of capacitive proximity sensors, especially as used within wearable electronic devices. For example, the distance between a capacitive proximity sensor and the object being sensed increases as the area of the capacitive sensor element increases. However, portable and wearable electronic devices are generally small for ease of use, and therefore, are limited in space to accommodate such sensors. Examples of capacitive proximity sensors described herein advantageously utilize space within electronic devices to maximize the effective area of the sensor, and therefore, increase effectiveness.

In at least one example, an internal structural member of the electronic device acts as, or includes, a component of the capacitive proximity sensor in a way that provides a compact, durable sensor capable of reliable performance in a variety of environments, regardless of, for example, variations in ambient light.

Along these lines, in at least one example, a wearable electronic device includes one or more components within an internal volume thereof, including a combined structural-sensing member. This combined structural-sensing member can provide strength and rigidity to the electronic device, as well as sensing capabilities, in a compact and durable configuration.

In one example, a structural member of the electronic device includes an electronic component capable of collecting or having an electrical charge. During use, the electronic component, and therefore, at least a portion of the structural member, can be used as part of a capacitive proximity sensor. In at least one example, the structural member can be integrally formed as a single piece with the electronic component. Alternatively, the electronic component of the structural member can be separately formed and then joined with the structural member as a single or unitary structural member of the electronic device. In any case, the electronic component of the structural member can increase the structural integrity of the structural member to add strength, rigidity, and durability to the electronic device in addition to the charge collecting and capacitive sensing capabilities thereof.

In at least one example, the electronic component of the structural member can be used as more than one sensor and/or in one or more sensing systems. For example, a processor and sensing circuit can be electrically coupled to the electronic component of the structural member. The processor can be configured to alternate the electronic component and sensing circuit between a first sensor and a second sensor. The first sensor can include a capacitive proximity sensor and the second sensor can include an antenna. The antenna can be configured to receive/sense and emit electromagnetic waves propagating into and out from the electronic device, respectively.

In this way, a multiplexing electronic component of the structural member can serve as both a proximity sensor and an antenna, in addition to adding structural strength and durability to the device, without the need for separate components. The physical configuration of the structural member and its electronic component, as disclosed herein, can serve as three components in one, thus reducing the space occupied by the components inside the electronic device.

These and other embodiments are discussed below with reference to FIGS. 1-18. However, those skilled in the art will readily appreciate that the detailed description given herein with respect to these figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

Turning now to the figures, FIG. 1 illustrates a schematic view of a device 100 including a housing 102. The device 100 can include a number of internal components disposed within, or at least partially within, the housing 102. For example, the device 100 can include a display assembly 104 along with one or more other electronic components 106, 108, 110, 112. Electronic components 106-112 and the display assembly 104 are shown in dotted lines to indicate that these components are not required but merely exemplary of components found in the devices 100 described herein. As such, the number and types of components illustrated in FIG. 1 as part of device 100 may vary in one or more other examples. Electronic components 106-112 may include any number of electronic components, including sensors, batteries, circuitry including sensing circuitry, processors, structural components, and the like.

In at least one example, device 100 includes a securement device 114 configured to secure device 100 against an object 116. In at least one example, securement device 114 includes a strap, a clip, or another securement mechanism. Securement device 114 can be configured to removably secure device 100 against object 116. In at least one example, object 116 can include a body of a user. In some examples, device 100 may be referred to herein as a wearable device 100. That is, device 100 can be donned by a user via securement device 114. Thus, object 116 can include a body part such as an arm, a leg, a wrist, a hand, or a head of a user.

In at least one example, specifically where device 100 includes display assembly 104, securement device 114 can be configured to secure device 100 against object 116 in such a way that display assembly 104 is oriented away from object 116. In such an example, display assembly 104 can be visible when device 100 is secured to object 116. In general, and as referred to herein, a "top" or "front" portion, side, or cover of device 100 includes portions thereof that are disposed or oriented away from object 116, such as portions near display assembly 104 or front cover 118 of device 100. Conversely, as referred to herein, a "bottom" or "back" portion, side, or cover of device 100 includes portions thereof that are disposed or oriented at or towards object 116 when securement device 114 secures device 100 to object 116. Such "back" or "bottom" portions of device 100 can include portions at or near back cover 120.

In at least one example, device 100 can also include a structural member 122 disposed at least partially within housing 102 of device 100. Structural member 122 can be, for example, disposed at or near a back portion of housing 102, such as at or near a back plate or back cover 120, in order to provide added strength and structural rigidity to back cover 120 or housing 102 in general. In at least one example, structural member 122 includes materials and/or structure that is stronger or more durable than those of back cover 120. This can be the case, for example, where back cover 120 is designed and configured to be thin and aesthetically pleasing or using materials that are at least partially transparent to electromagnetic waves and signals for accommodating sensors and antennas sending and receiving signals there through. In such examples, it can be advantageous to include an interior member, such as structural member 122 that adds strength, support, and rigidity to back cover 120. In this way, advantageously, back cover 120 can be designed for purposes other than just structural purposes, as described above, while device 100 maintains structural integrity and general durability via structural member 122.

One or more other structural members, which are not explicitly shown in FIG. 1, can also be included on, around, or within device 100. Components 106-112 can also include one or more structural members serving the same or similar functions as described herein with regard to structural member 122. However, at least one example includes structural member 122 disposed at or near back cover 120 of device 100 such that structural member 122 is disposed at or near object 116 when back cover 120 or a bottom/back portion of device 100 is secured against object 116.

In at least one example, structural member 122 includes an electronic component 124. Electronic component 124 can be integrally formed with, and can be a part of, a single structural member 122. Alternatively, structural member 122 can be separately formed and then joined together with electronic component 124 as a single, unitary piece. In one example, electronic component 124 is a portion of structural member 122 such that electronic component 124 strengthens and provides additional rigidity to structural member 122. In another example, all of structural member 122 is an electronic component so that electronic component 124 forms all of structural member 122. Electronic component 124 is indicated in dotted lines in the schematic of FIG. 1 to indicate the various positions and arrangements of structural member 122 and electronic component 124 noted above.

In at least one example, electronic component 124 includes an electrically conductive material that can collect and/or hold or retain an electric charge. Portions of structural member 122 other than electronic component 124 can also include electrically conductive material to serve as part of a charged member for capacitive proximity sensing. In at least one example, only the electronic component 124 portion of structural member 122 includes conductive material so that the rest of structural member 122 includes one or more non-conducting materials. In this way, electronic component 124 can serve as a charging plate for a capacitive sensor.

Advantageously, as indicated above and shown in FIG. 1, electronic component 124 can be disposed at or near the bottom of device 100, such as at or near back cover 120, when securement device 114 secures device 100 to object 116.

In some examples, during use, a bottom or back portion of device 100, such as back cover 120, can act as a dielectric material between two charged objects or components, namely object 116 and electronic component 124. When coupled to a sensing circuit and/or processor within device 100, such as one or more of the components 106, 108, 110, and/or 112 of device 100, electronic component 124 can then serve as part of a capacitive sensor configured to sense, detect, and/or determine a distance between object 116 and electronic component 124. Based on the charge collected on electronic component 124 and the known position of electronic component 124 relative to an outside surface of housing 102, including, for example, a thickness of back cover 120, the sensing circuit and the processor can determine a distance between the bottom of device 100 and object 116. Thus, with electronic component 124 configured as a capacitive proximity sensor, the processor can determine whether device 100 is secured to object 116 or not.

This positional information of device 100 relative to object 116 can inform any number of other functions of device 100 that depend on proximity to object 116. These other functions can vary depending on the type of device, some examples of which will be discussed in more detail below. These functions can also vary depending on the type of object 116. Some examples, here noted generally with regard to object 116 being a human body or body part, include functions regarding initiating active or sleep modes of device 100, other sensor and data collection including heartbeat monitoring, pulse oximeter readings, body temperature data collection, and the like.

Figure 2:
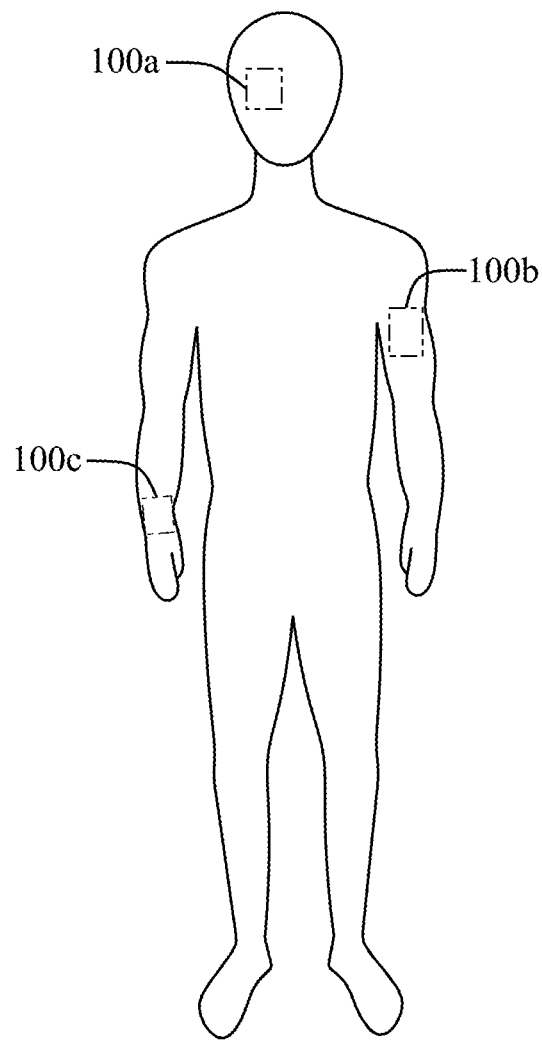
FIG. 2 shows a schematic view of a user wearing one or more electronic devices.

Along these lines, one non-limiting example of object 116 includes a human body or a human body part. FIG. 2 illustrates a user wearing a number of electronic devices 100a, 100b, 100c, each of which can be similar to device 100 shown in FIG. 1. As illustrated in FIG. 2, electronic devices 100a, 100b, 100c can be worn on a user's arm, including the upper arm and/or lower arm/wrist, or on a user's head or face, for example over one or more eyes of the user. In addition to the examples of electronic devices 100a, 100b, 100c shown on the body of a user in FIG. 2, electronic devices can be worn on other parts of the body, including but not limited to the legs, feet, or torso of the user. In each example, electronic component 124 can be compactly disposed with, or as a part of, structural member 122 to provide the advantages described herein.

It will be appreciated that electronic devices according to the schematic of device 100 shown in FIG. 1 can take a variety of forms and perform a variety of functions. The features, components, arrangements, configurations, examples, and specific advantages thereof, as described herein with regard to the example of FIG. 1, can, in isolation or in combination with one another, be applicable to, or combined with, any other feature, component, arrangement, configuration, examples, or combinations thereof, including those shown in subsequent figures and discussed herein.

Figure 3:
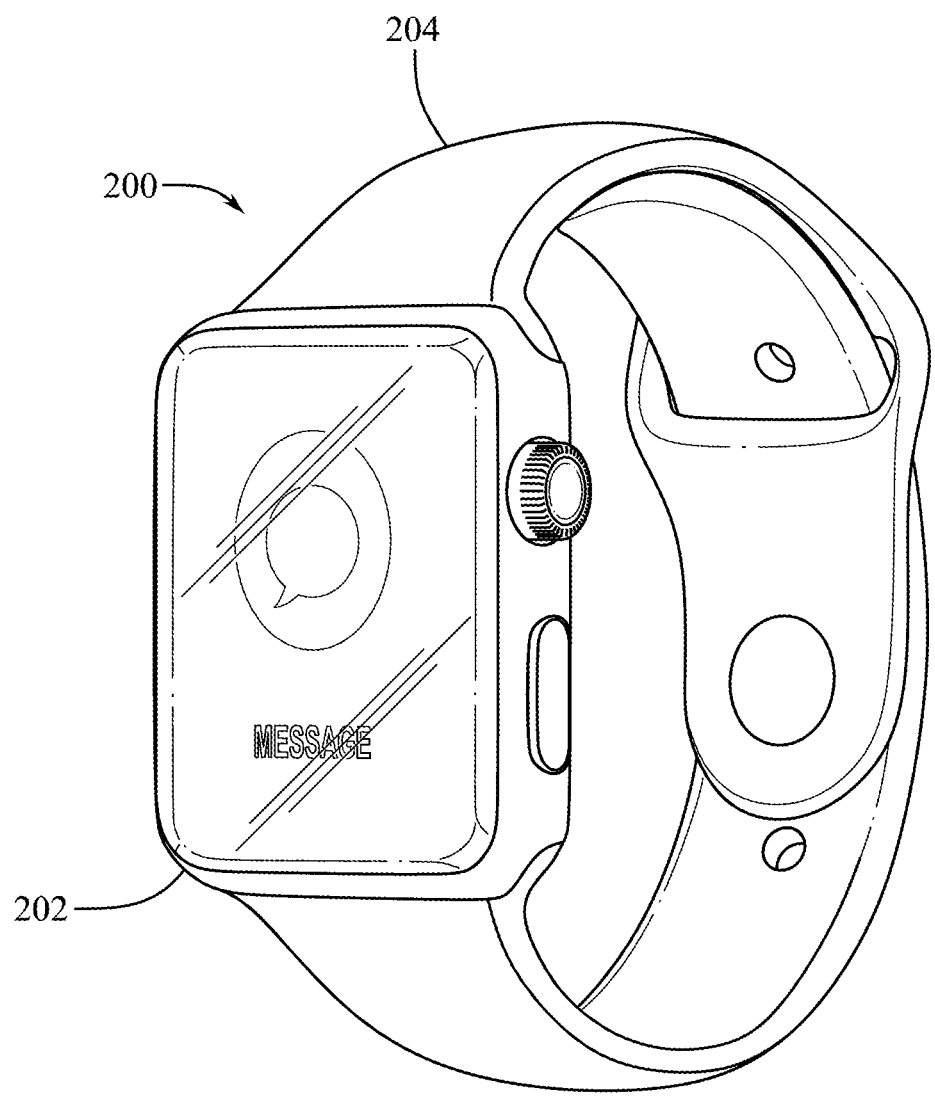
FIG. 3 shows a perspective view of an electronic device.

As such, FIGS. 3-16 illustrate examples of an electronic device in the form of a wearable, portable/mobile watch device configured to be worn on the arm or wrist of a user. In particular, FIG. 3 shows an example of an electronic device 200 (or simply "device"). Device 200 shown in FIG. 3 is a watch, such as a smartwatch. The smartwatch of FIG. 3 is merely one representative example of a device that can be used in conjunction with the systems and methods disclosed herein. Device 200 can correspond to any form of wearable electronic device, a portable media player, a media storage device, a portable digital assistant ("PDA"), a tablet computer, a computer, a mobile communication device, a GPS unit, a remote control device, or other electronic device. Device 200 can be referred to as an electronic device, or a consumer device. In some examples, device 200 can include a body 202 that can carry operational components, for example, in an internal volume at least partially defined by a housing of the body. Device 200 can also include a securement component 204, such as the strap shown or one or more other securement components, such as securement device 114 shown in FIG. 1, that can secure device 200 to a body of a user, as desired. Further details of device 200 are provided below with reference to the exploded view of FIG. 4.

Figure 4:
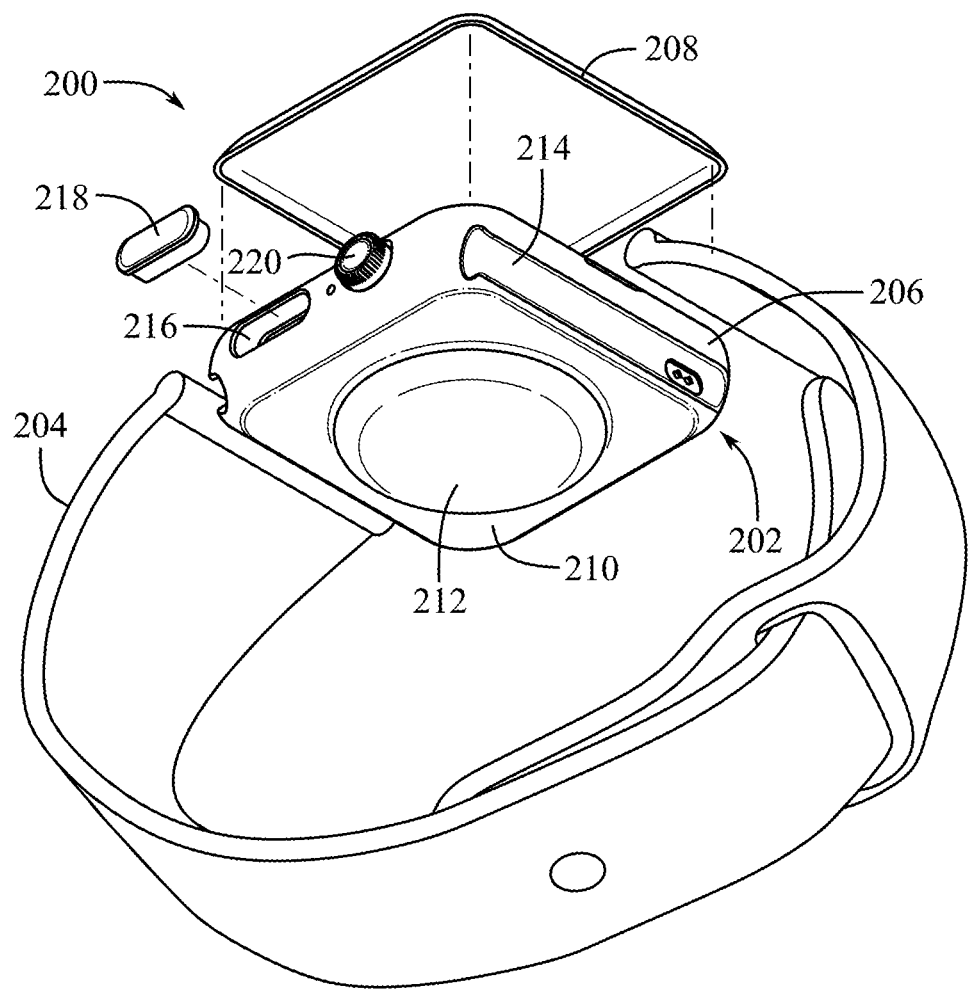
FIG. 4 shows a lower, perspective, exploded view of an electronic device.

Referring now to FIG. 4, device 200 can include body 202 having a housing 206 and a front cover 208 attached to housing 206. Housing 206 can substantially define at least a portion of an exterior surface of device 200. Front cover 208 can include a ceramic material such as sapphire, glass, plastic, or any other substantially transparent material, component, or assembly. Front cover 208 can cover or otherwise overlay a display, a camera, a touch sensitive surface such as a touchscreen, or any other component of device 200. Front cover 208 can define at least a portion of an exterior front surface of device 200. Together, housing 206 and front cover 208 can substantially define the exterior surface of device 200.

In some examples, housing 206 can include a component, referred to herein as a back cover 210, that defines at least a portion of an exterior surface of device 200. Back cover 210 can also be referred to as a back case or a back plate, and can be disposed at a bottom or back of device 200, which, as noted above, corresponds to a side of device 200 configured to be pressed against or near the user's body when device 200 is secured thereto during use. Back cover 210 can at least partially define a back surface of device 200. In at least one example, the back surface of device 200 is disposed opposite the front surface thereof. In some examples, back cover 210 can be attached to one or more other components, such as housing 206. Back cover 210 can be attached to housing 206 by any method known in the art or developed in the future, such as adhesive bonding, brazing, welding, over-molding, interference fitting, or other securing methods.

Back cover 210 can define one or more apertures or through holes. A transparent component 212 can be disposed in or over the one or more apertures such that transparent component 212 extends across or spans the one or more apertures. In some examples, transparent component 212 can be visually transparent and can include any transparent material including a ceramic material, such as sapphire. Transparent component 212 can provide visual and electromagnetic access to an exterior environment for one or more components of device 200, as described herein.

Housing 206 can include one or more features to receive or couple to other components of device 200. For example, housing 206 can include securement features 214, such as an indentation or other physical feature, protrusion, or other securement feature to receive one or more securement components 204, such as the strap shown, and an aperture 216 to receive a button 218. In at least one example, securement feature 214 together with securement component 204 can be part of a securement device 114, such as that shown in FIG. 1. Alternatively, securement feature 214 can take another form so as to be configured to secure device 200 to the body of a user without any additional securement component 204 received therein. For example, securement feature 214 can include a strap, such as securement component 204 shown, integrally formed or at least permanently fixed to housing 206 without indentations or other physical features of housing 206. Housing 206 can also define one or more apertures to receive additional input components, such as a dial or a crown 220.

As noted above, device 200 can include back cover 210 that can be attached to housing 206, for example, opposite display assembly 208. Back cover 210 can include ceramic, plastic, metal, or combinations thereof. In some examples, back cover 210 can at least partially form or define a back, exterior surface of device 200. Transparent component 212 can also at least partially form a back, exterior surface of device 200 when coupled with back cover 210. Transparent component 212 can be transparent to any desired wavelengths of electromagnetic radiation, such as visible light, infrared light, radio waves, or combinations thereof. In some examples, transparent component 212 can allow sensors and/or emitters disposed in housing 206 to communicate with the external environment. In some examples, the transparent component 212 and/or back cover 210 can allow one or more sensors or antennas disposed in an internal volume of housing 206 to emit and/or receive electromagnetic radiation, as described further herein. Together, housing 206, display assembly 208, and back cover 210 can substantially define an internal volume and an external, back surface of device 200.

As noted above, electronic devices in accordance with that shown in FIG. 4 can take a variety of forms and can perform a variety of functions. The features, components, arrangements, configurations, examples, and specific advantages thereof, as described herein with regard to the example of FIG. 4, can, in isolation or in combination with one another, be applicable to, or combined with, any other feature, component, arrangement, configuration, examples, or combinations thereof, including those shown in subsequent or previous figures and described herein. Further details of the device 200 are provided below with reference to FIG. 5.

Figure 5:
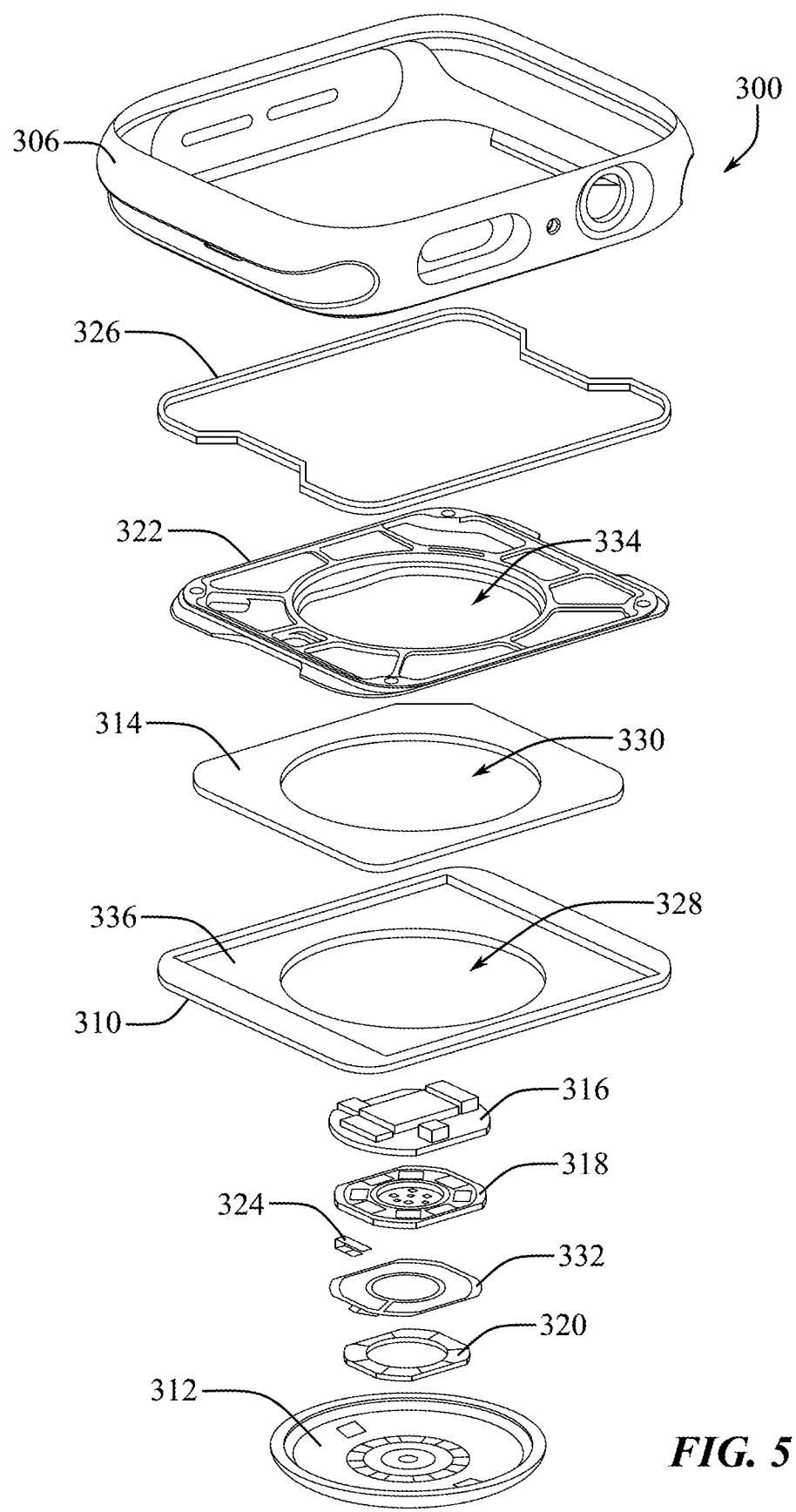
FIG. 5 illustrates an exploded view of a portion of an electronic device.

FIG. 5 illustrates an exploded view of one example of a portion of an electronic device 300, which can include at least some similar components as those shown and described herein with regard to other devices examples. Device 300 can include additional components and features, which have been omitted from other figures and examples for simplicity. In some examples, a back cover 310 can carry a number of components thereon, such as an electronic component 314, a logic board 316, a first sensor or antenna module 318, and a light directing component 320, a second sensor or antenna module 332, and a connection component 324 to electrically connect second sensor or antenna module 332 to one or more components of device 300, such as logic board 316. In some examples, one or more of these components, such as a first sensor or antenna module 318 and a second sensor or antenna module 332, can be disposed over a transparent component 312 situated with back cover 310. In some examples, a seal or frame element 326 can be disposed between back cover 310 and housing 306 to provide or define a barrier between the internal volume and the ambient environment, as described herein.

As noted, various components of device 300, including first sensor or antenna module 318, light directing component 320, and second sensor or antenna module 332, can be disposed within device 300 such that they can emit and receive electromagnetic signals through transparent component 312 from an internal volume of device 300. The number and arrangement of these or other sensing/antenna components within device 300 can vary in one or more other examples. One or more other examples of device 300 can include, for example, one or more of audio sensors (e.g., microphones), optical or visual sensors (e.g., cameras, visible light sensors, infrared sensors, or ultraviolet light sensors), proximity sensors, touch sensors, force sensors, mechanical devices (e.g., crowns, switches, buttons, or keys), vibration sensors, orientation sensors, motion sensors (e.g., accelerometers or velocity sensors), location sensors (e.g., global positioning system (GPS) devices), thermal sensors, communication devices (e.g., wired or wireless communication devices), resistive sensors, magnetic sensors, electroactive polymers (EAPs), strain gauges, electrodes, or some combination thereof. Such sensors, such as electrodes or other sensors listed above, can be disposed within an internal volume of device 300 and configured to send and receive electromagnetic waves or other signals through back cover 310 and/or transparent component 312. In at least one example, sensors listed above and described herein can be configured to determine a user's pulse, blood oxygen level, temperature, or other biometric data of the user through the back cover 310 and/or transparent component 312.

In some examples, back cover 310 can define a back cover aperture 328 and electronic component 314 can define an electronic component aperture 330. In addition, device 300 can include a structural member 322 that defines a structural member aperture 334. When assembled together, each aperture 328, 330, 334 at least partially aligns with the other apertures and can correspond in position with transparent component 312 such that various sensors and antennas described herein, which can be disposed within device 300, can emit and receive signals through back cover 310, electronic component 314, and corresponding transparent component 312. In at least one example, apertures 328, 330, 334 are generally concentric to form a single or combined aperture. Back cover aperture 328 and transparent component 312 are shown as circular, but can be any other shape or size that allows the transmission of electromagnetic energy there through. For example, back cover aperture 328 and transparent component 312 can be substantially rectangular, triangular, or any desired polygonal or polyhedral shape.

When device 300 is assembled, structural member 322 and electronic component 314 can be fitted together with back cover 310 to strengthen and add structural rigidity to back cover 310. In the illustrated example of FIG. 5, structural member 322 and electronic component 314 are shown as two separate components, such that when assembled, electronic component 314 is disposed against a top surface 336 of back cover 310 and sandwiched between back cover 310 and structural component 332. In at least one example, back cover 310 at least partially forms or defines an outer surface of device 300. Because of the absence of material at back cover aperture 328 and the aesthetic function of back cover 310 as an outer surface of device 300, it can be advantageous to couple back cover 310 with structural member 322 to improve the strength, rigidity, and durability of back cover 310.

As noted herein, some examples include structural member 322 and electronic component 314 formed as a single, unitary piece or two pieces molded or formed together as one. In at least one example, electronic component 314 can be a coating or a film applied to structural member 322. In at least one example, electronic component can be compression molded, stamped, or otherwise integrally formed together with structural member 322. In such cases, the combined structural member 322 and electronic component 314 can be coupled with back cover 310 to provide structural support and rigidity thereto, as noted above. Further details of a subassembly of device 300 are provided below with reference to FIG. 6.

Figure 6:
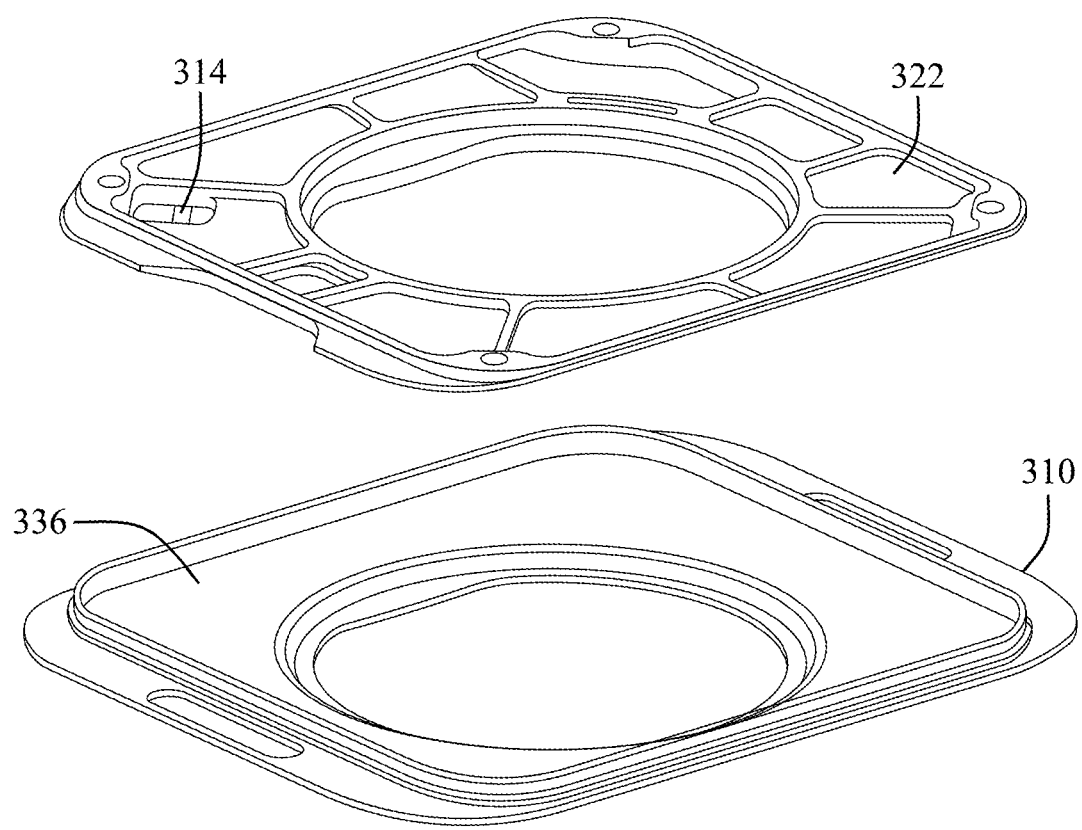
FIG. 6 illustrates an exploded view of a portion of an electronic device.

FIG. 6 illustrates an exploded view of a subassembly of device 300, including back cover 310 and structural member 322. A lower portion or surface of structural portion 332 includes electronic component 314, partially visible in FIG. 6 through an opening in structural member 322, and can be contoured such that the lower surface matches or mates with top surface 336 of back cover 310. Additional details of structural member 322 are provided below with reference to FIG. 7.

Figure 7:
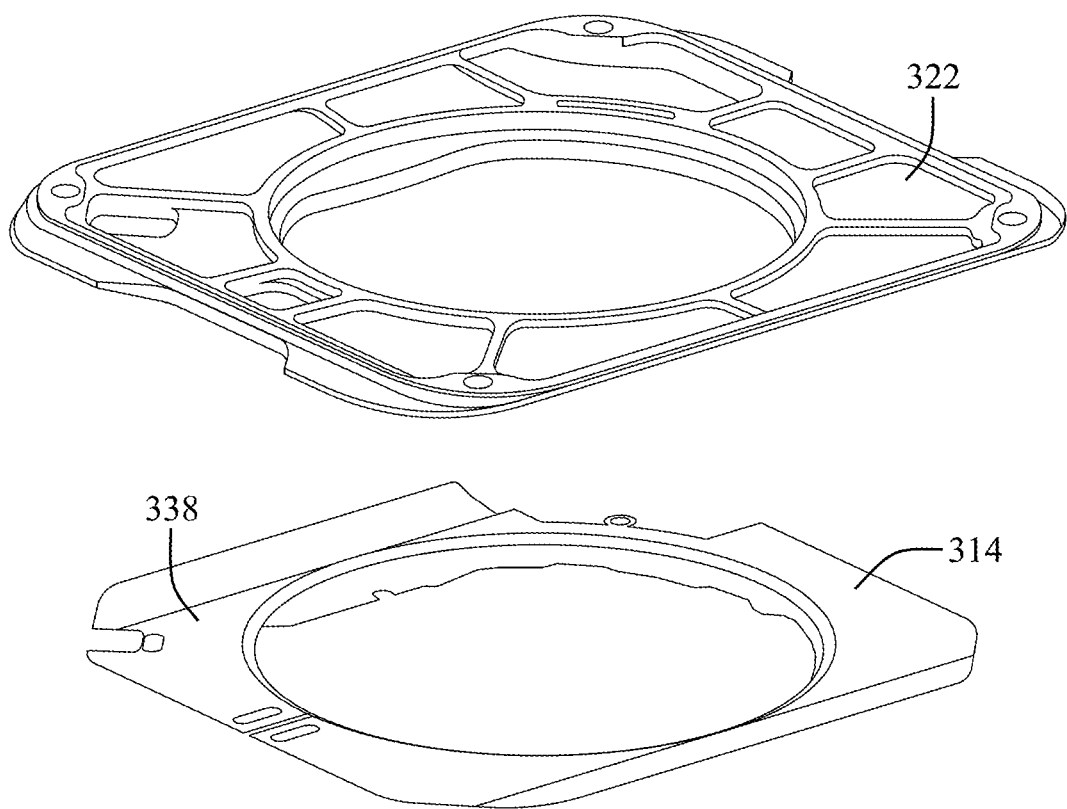
FIG. 7 illustrates an exploded view of a portion of an electronic device.

FIG. 7 further illustrates an exploded view of structural member 322 and electronic component 314. In at least one example, electronic component 314 includes a top surface 338 that is contoured to fit against and mate with a lower surface of structural member 322. In this way, minimal space is present between electronic component 314 and structural member 322 to conserve space within device 300. In addition, as noted above, electronic component 314, either when formed together with structural component 332 as a coating or when formed separately and joined together with structural component 332, can increase the structural rigidity and strength of structural member 322, and therefore, back cover 310. In this way, electronic component 314 can be considered as a portion of structural member 322, providing structural strength and added rigidity to back cover 310 when assembled together in device 300.

Figure 8:
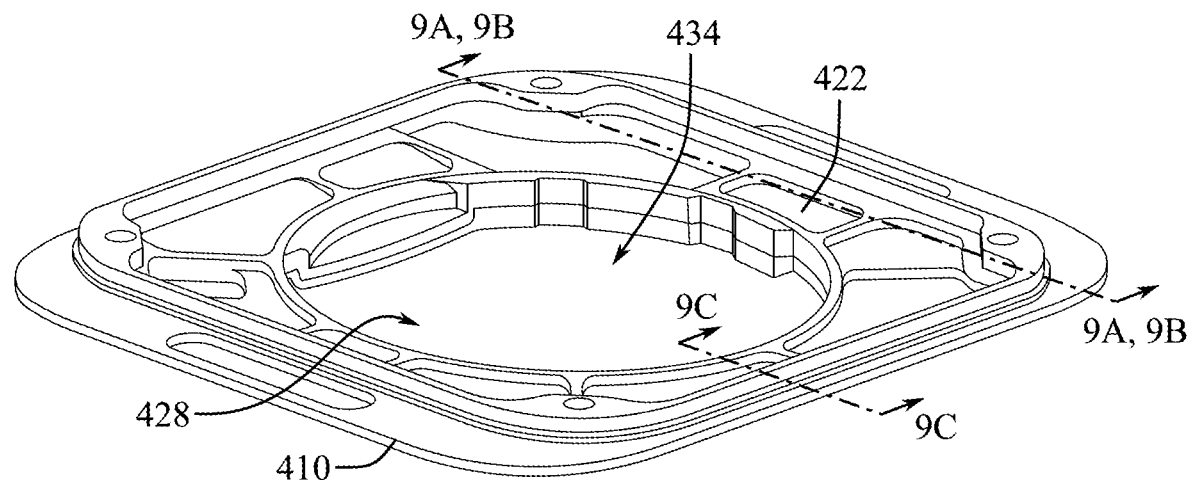
FIG. 8 illustrates a perspective view of a portion of an electronic device.

FIG. 8 illustrates another example of a subassembly of an electronic device, including a back cover 410 defining a cover aperture 428 assembled together with a structural member 422 defining a structural member aperture 434. Again, apertures 428, 434 of the various components can be aligned when assembled to form a single aperture through a bottom or a back portion of an electronic device. In at least one example, apertures 428, 434 are generally concentric to form a single, combined aperture together. In the illustration of FIG. 8, an electronic component associated with structural member 422 is not visible, as it may be faced downward or disposed between structural member 422 and back cover 410.

One will appreciate that a structural member 422 and associate electronic component can be formed and shaped such that a contour thereof compliments, matches, and mates with a contour of a top surface of back cover 410 to form an area of contact between the structural member 422 and the back cover 410. In this way, when assembled as shown, structural member 422 and electronic component 414 thereof can provide the advantages of other structural members and electronic components described herein, including adding strength and rigidity to back cover 410. That is, in at least one example, structural member 422 and back cover 410 are configured and disposed within a device such that any forces acting on back cover 410 from outside the device are absorbed or resisted by structural member 422. In at least one example, structural member 422 and back cover 410 are configured together such that any yielding of one will cause yielding in the other such that back cover 410 and structural member 422 yield together, at least partially, as a single piece to resist forces impinged thereon.

Electronic devices in accordance with those shown in FIGS. 5-8 can take a variety of forms and perform a variety of functions. The features, components, arrangements, configurations, examples, and specific advantages thereof, as described herein with regard to the examples of FIGS. 5-7, can, in isolation or in combination with one another, be applicable to, or combined with, any other feature, component, arrangement, configuration, examples, or combinations thereof, including those shown in subsequent or previous figures and described herein. Additional details of structural member 422 are provided below with reference to FIGS. 9A-9B.

Figure 9A:
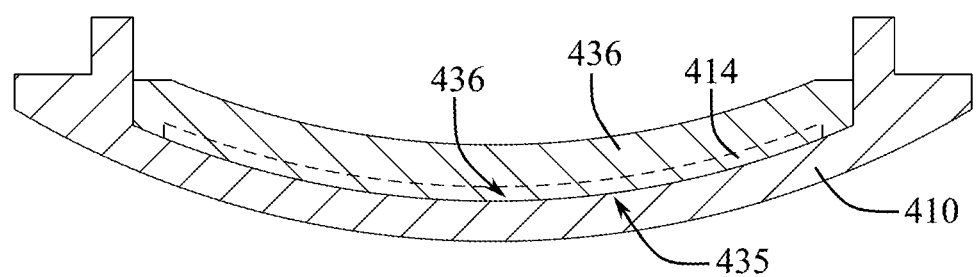
FIG. 9A illustrates a cross-sectional view of a portion of an electronic device.
Figure 9B:
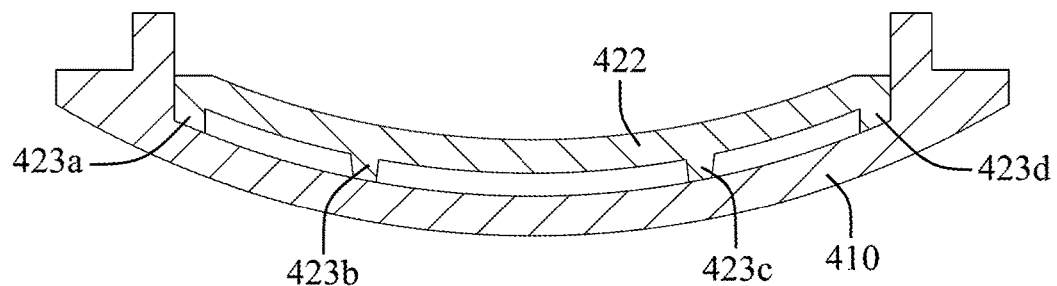
FIG. 9B illustrates a cross-sectional view of a portion of an electronic device.

FIGS. 9A and 9B illustrate cross-sectional views of examples of structural member 422 disposed with back cover 410 at the viewing plane indicated by the corresponding arrows in FIG. 8. As shown in FIG. 9A, structural member 422 includes a lower surface 435 that can be disposed, at least partially, against a top surface 436 of back cover 410. Also indicated by dotted lines in FIG. 9A is electronic component 414, which can form a part or all of structural member 422 or, as discussed in some examples herein, be disposed between structural member 422 and back cover 410, as shown. Some examples can include electronic component 414 forming at least a portion of lower surface 435 of structural member 422. In examples where electronic component 414 forms all of structural component 422, structural component 422 can include one or more electrically conductive materials so that all of structural component 422 can collect an electric charge as part of a capacitive proximity sensor.

In the illustrated example of FIG. 9A, structural member 422 makes contact along at least a portion of top surface of back cover 410, with structural member 422 being coupled with back cover 410 via one or more attachment means. Such attachment means can include, but are not limited to, adhesives, snaps or clips, friction-fitting, snap-fitting, or any other attachment feature or member configured to hold back cover 410 and structural member 422 together as shown.

In at least one example, all or at least a portion of lower surface 435 of structural member matches, or physically compliments, top surface 436 of back cover 410. That is, in at least one example, a cross-sectional profile or contour of lower surface 435 is the same or similar to at least a portion of the cross-sectional profile or contour of top surface 436 of back cover 410. In this way, when back cover 410 and structural member 422 are brought together, as shown in FIG. 9A, all or at least a substantial portion of bottom surface 435 of structural member 422 contacts top surface 436 of back cover 410. Thus, structural member 422 is configured to strengthen and/or add rigidity to back cover 410.

For example, when coupled to, or disposed with, back cover 410 as shown, structural member 422 can be configured to absorb or resist at least a portion of the forces and stresses that can act on back cover 410 during use. In at least one example, the cost of material and/or the aesthetic appearance considerations of the design of back cover 410, which can form at least a portion of the outside of an electronic device, can benefit from added support from structural member 422, which can be made of stronger or more durable, but less aesthetically appealing materials and shapes (in one non-limiting example) in order to withstand repeated stresses during use.

In at least one example, electronic component 414 can be formed with structural member 422 as a coating thereon, or stamped or molded with structural component 422, as a portion thereof to match or compliment the contour and shape of structural member 422 to form an area of contact between structural member 422 and the back cover 410. In this way, similar to how structural member 422 strengthens and/or supports back cover 410 as noted above, electronic component 414 adds structural integrity, strength, and durability to the rest of structural member 422. Thus, electronic component 414 can provide multiple advantages in one piece, including the ability to act as part of a capacitive proximity sensor, as is described in greater detail above and below.

In one example, electronic component 414 can be electrically isolated from other components within a device, other than connected circuitry or wires necessary for its function and/or for electrical grounding, between the rest of structural member 422 and back cover 410. Likewise, in at least one example, all of structural member 422, including electrical component 414 portion, can be electrically isolated from other components within the device.

Electronic devices in accordance with those shown in FIG. 9A can take a variety of forms and can perform a variety of functions. The features, components, arrangements, configurations, examples, and specific advantages thereof, as described herein with regard to the example of FIG. 9A, can, in isolation or in combination with one another, be applicable to, or combined with, any other feature, component, arrangement, configuration, examples, or combinations thereof, including those shown in subsequent or previous figures, and as described herein.

Alternatively, as shown in FIG. 9B, an example of structural member 422 can include discrete contact points between a lower surface 435 thereof and top surface 436 of back cover 410. For example, as shown, structural member 422 can include one or more ridges 423a, 423b, 423c, 423d or other features that serve as contact points between structural member 422 and back cover 410. In this way, material can be conserved while ridges 423a-d serve to maintain the structural rigidity and strength of structural member 42.

In at least one example, only an outer perimeter edge of a structural member 422 couples to back cover 410, such as at ridges 423a and 423b, to provide added strength thereto. In one or more other examples, only a portion of a structural member 422 contacts back cover 410 but is still coupled to back cover 410 in such a way that a structural member 422 absorbs or resists forces acting on back cover 410.

Electronic devices in accordance with those shown in FIG. 9B can take a variety of forms and perform a variety of functions. The features, components, arrangements, configurations, examples, and specific advantages thereof, as described herein with regard to the example of FIG. 9B, can, in isolation or in combination with one another, be applicable to, or combined with, any other feature, component, arrangement, configuration, examples, or combinations thereof, including those shown in subsequent or previous figures and described herein. Additional details of the back cover configuration are provided below with reference to FIG. 9C.

Figure 9C:
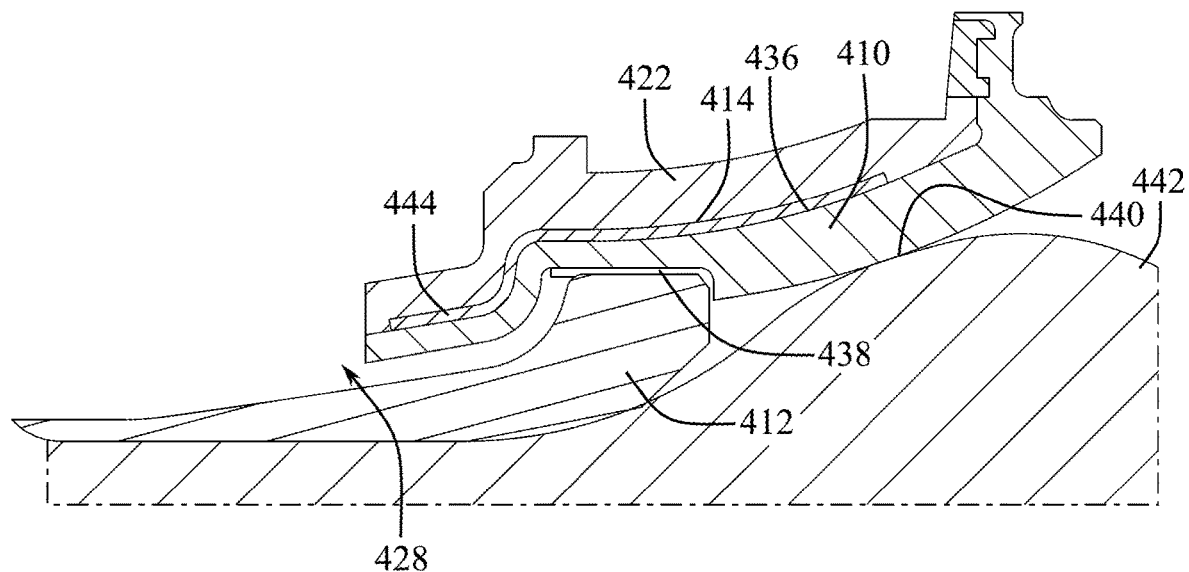
FIG. 9C illustrates a cross-sectional view of a portion of an electronic device.

To better illustrate the configuration of back cover 410 together with a structural member 422 and its associated electronic component 414, FIG. 9C illustrates a partial cross-sectional view of the subassembly at the plane indicated by the dotted line and arrows in FIG. 8. In addition to the assembly of FIG. 8, the cross-sectional view of FIG. 9C illustrates transparent component 412 and an object 442, such as a body of a user, against which back cover 410 and a transparent component 412 can be disposed during use. The cross-sectional view of FIG. 9C also illustrates a portion of a transparent component 412 disposed over back cover aperture 428, similar to other transparent components shown and described herein. From this cross-sectional view, one can see that in at least one example, an electronic component 414 is disposed with a structural member 422, between a structural member 422 and back cover 410, and against a top surface 436 of back cover 410. One example of electronic component 414 includes a contour that matches or compliments top surface 436 of back cover 410 where the two components contact one another.

In examples where electronic component 414 forms all of structural component 422, structural component 422 can include one or more electrically conductive materials so that all of structural component 422 can collect an electric charge as part of a capacitive proximity sensor. In at least one example, structural member 422 and/or electrical component 414 thereof can be electrically isolated from back cover 410, housing 206, or any other component of the device in which electronic component 414 and structural member 422 are disposed.

Electronic component 414, whether formed as a distinct component or as an integral portion or sub-portion of a structural member 422, can include one or more electrically conductive materials capable of collecting an electric charge. For example, electronic component 414 can include copper, gold, silver, zinc, nickel, platinum, titanium, stainless steel, aluminum, alloys and combinations thereof, and other similarly conductive materials.

Additionally, in at least one example, a structural member 422 can also include one or more electronically conductive materials such that a structural member 422 and electronic component form a single piece configured to collect or hold an electric charge. Accordingly, in at least one example, electrical component 414 can act as a charge plate as part of a capacitive sensor. In an alternative example, where a structural member 422. In at least one example, one or more sensing circuits and processors can be coupled to electronic component 414 and configured to determine the amount of electric charge at or on electronic component 414. In this way, electronic component 414 can form part of a sensor or sensor module configured to detect the presence of object 442 disposed at, near, or against back cover 410 and transparent component 412.

As the presence of object 442 draws nearer to electronic component 414 during use, a charge associated with object 442, such as the skin of a user's wrist, along with any intermediary components, such as back cover 410 and/or transparent component 412 acting as dielectric mediums, affects the electrical charge at or on electronic component 414. The change in this charge at or on electronic component 414 can be detected, for example, with connected sensor circuitry and one or more processors, to determine the presence or absence of object 442. In this way, electronic component 414 can be part of a capacitive proximity sensor or a capacitive proximity sensor module configured to determine when a user is wearing or not wearing an electronic device that electronic component 414 is a part of, such as examples of the electronic devices described herein. Such a sensor module can include one or more processors electrically coupled to electronic component 414, and/or the structural member itself acting as electronic component in examples where structural member 422 includes electrically conductive materials, via one or more components of a sensor circuit.

As charge builds up on electronic component 414 and/or support structure 422, that charge can be measured by the sensor circuit and processor to determine the presence of an object, such as object 442. For example, a threshold charge value can be set such that when the charge of electronic component 414 and/or structural member 422 changes due to the presence of object 442 at or near back cover 410, the actual charge on structural member/electrical component 422/414 passes or changes above or below the set threshold. The processor can detect this charge, compare it to the set threshold, and determine presence or absence of object 442 accordingly. In at least one example, object 442 is the body/skin of a user. In this example, the processor, in conjunction with the sensing circuit and electronic component 414 and/or structural member 422, can determine when the user is wearing the device in which structural member 422 and electronic component 414 are disposed.

The affect that object 442 has on the charge held/collected by electronic component 414 depends, at least partially, on the distance between object 442 and electronic component 414. The smaller the distance between object 442 and electronic component 414, the greater the affect object 442 will have on the charge of electronic component 414. As shown in FIG. 9C, electronic component 414 is shaped to be disposed as close as possible to object 442. For example, at least a portion of electronic component, such as an inner portion 444 of electronic component 414, can extend downward towards object 442 at or near aperture 428 of back cover 410. In this way, electronic component 414 can be configured to minimize a distance between electronic component 414 and object 442, where possible, depending on the contour, thickness, and shape of components disposed between electronic component 414 and object 442, such as back cover 410, transparent component 412, and an adhesive 438 holding transparent component 412 to back cover 410.

One will appreciate that the shape and configuration, including the specific cross-sectional contour of electronic component 414 shown in FIG. 9, can vary from one example to another to match with and accommodate different contours and shapes of other components of an electronic device, such as back cover 410, structural member 422, and transparent component 412.

In at least one example, structural member 422 can be disposed against or otherwise coupled with back cover 410 such that a lower surface of electronic component 414 is between about 0.1 mm and 5 mm, or between about 0.5 mm and 4 mm, or between about 0.75 mm and 3 mm, or between about 1 mm and 2 mm, for example about 1.5 mm away from object 442 when object 442 is in direct contact with back cover 410. In some examples, the distance between electronic component 414 and object 442 can include a thickness of back cover 410. In at least one example, the distance between electronic component 414 and object 442 can include a thickness of transparent component 412, or a combination of the thickness of transparent component 412 and back cover 410 where these two components overlap between electronic component 414 and object 442. Additionally, one or more adhesive layers, such as can be present between the various components, can also add to the distance between electronic component 414 and object 442. In any case, the processor coupled to electronic component 414 can be configured to detect a change in charge and compare it to a threshold charge to determine the presence of object 442, such as the user's body/skin, even when one or more other components of the device are disposed therebetween.

Electronic devices in accordance with assemblies and sub-assemblies shown in FIG. 9C can take a variety of forms and perform a variety of functions. The features, components, arrangements, configurations, examples, and specific advantages thereof, as described herein with regard to the example of FIG. 9C, can, in isolation or in combination with one another, be applicable to, or combined with, any other feature, component, arrangement, configuration, examples, or combinations thereof, including those shown in subsequent or previous figures and described herein.

Figure 10:
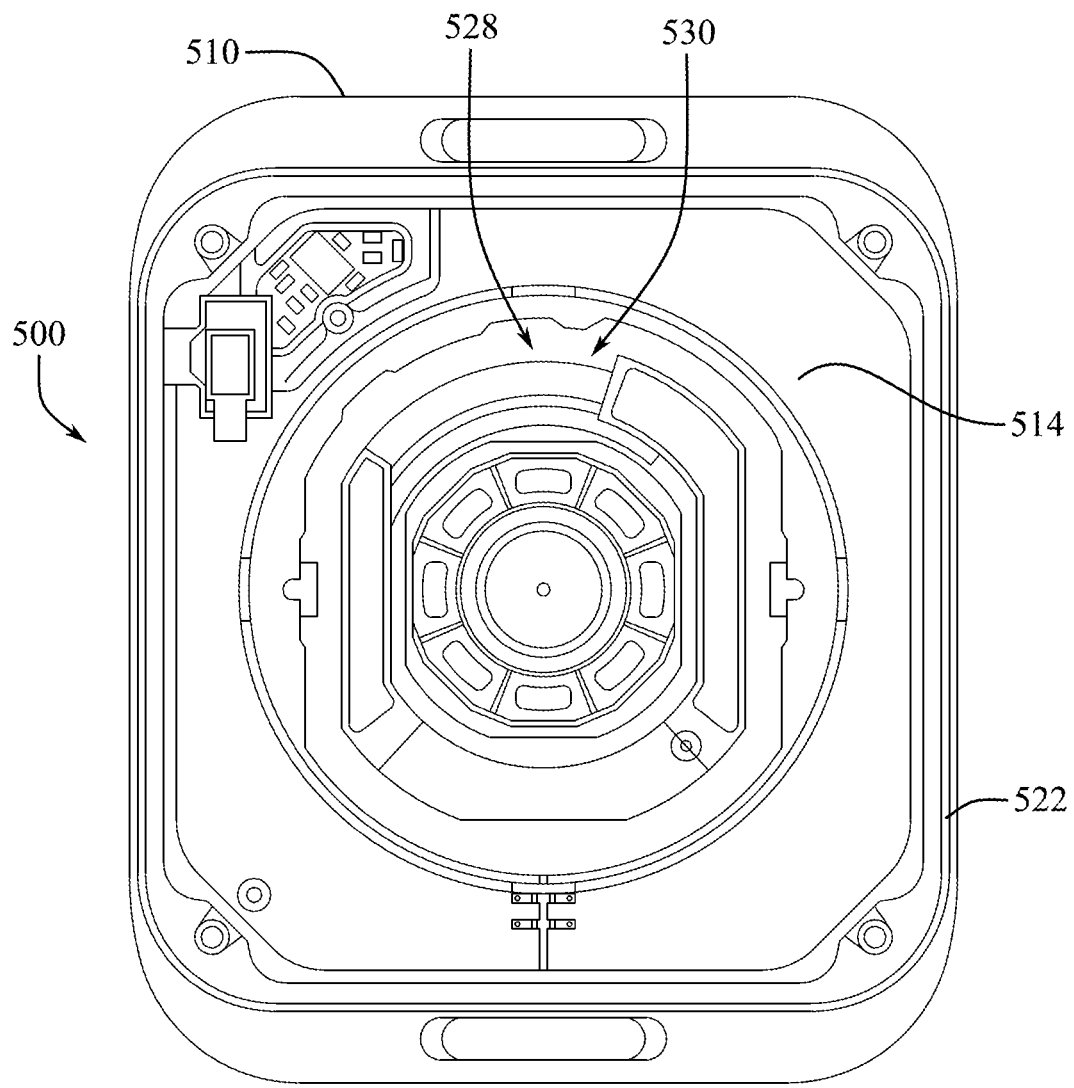
FIG. 10 illustrates a top view of a portion of an electronic device.

The affect that object 442 has on the charge held/collected by electronic component 414 also depends, at least partially, on the surface area of electronic component 414. FIG. 10 illustrates a top view of a sub assembly 500 of an example of an electronic device, similar to those described elsewhere herein, to illustrate the surface area of an electronic component 514.

As shown, electronic component 514 can be disposed on, near, against, or otherwise coupled with back cover 510 with electronic component aperture 530 corresponding in position with back cover aperture 528. An outside perimeter edge of structural members 522 is indicated, while not shown in whole, to show a relationship between the position thereof and electronic component 514. FIG. 10 also illustrates various components described above, such as various sensor and antenna components disposed above or corresponding to a position of aperture's 528, 530. In this way, electronic component 514 surrounds a central aperture of the device. In at least one example, electronic device 514 extends outward and away from electronic component aperture 530 but within an outer periphery of device 500 to maximize a surface area within the device. The greater the surface area of electronic component 514, the bigger the area of the sensed object can be covered thereby, and the more charge electronic component 514 can hold. Thus, increasing the surface area of electronic component 514 increases its capacity to sense object 442 from a greater distance. In at least one example, electronic component 514 includes at least one surface, for example a lower surface corresponding to lower surface 435 shown in FIGS. 9A and 9B, having an area of at least about 100 mm$^2$. In at least one example, this surface area can be between about 100 mm$^2$ and about 500 mm$^2$. In at least one example, this surface area can be between about 280 mm$^2$ and 436 mm$^2$, for example about 350 mm$^2$.

In at least one example, where object 442 includes a user's body/skin or an object with a similar electrical charge to that of human skin, electronic component 514 is configured in accordance with the surface areas, dimensions, and materials described herein to hold charge suitable for a coupled processor to detect object 442, as shown in FIG. 9C, when object 442 is about 30 mm away or less from electronic component 514, for example 20 mm, 15 mm, 10 mm, 5 mm, or less than 5 mm away. In at least one example, electronic component 514 is configured to detect object 442 at a distance of at least 30 mm or more. In at least one example, electronic component 514 is configured to detect object 442 at a distance of at least 40 mm away or in some examples at a distance of at least 50 mm away. In some examples, object 442 can be detected without making contact with back cover 410 and/or transparent component 412 but is still present within the detection ranges noted herein.

In at least one example, assuming 1.8-Volts of power supply to the electronic component, electronic components described herein, such as electronic component 514, are configured to detect an object, such as a user's skin, making contact with back cover 410 or transparent component 412 with a measure capacitance of 3800 femtofarads (fF). At a distance of 5 mm between the user's skin and back cover 410 or transparent component 412, electronic components described herein can be configured to measure a capacitance of about 1000 fF. At a 10 mm distance, the measured capacitance can be about 500, at a 15 mm distance, the measured capacitance can be about 300 fF, and at 20 mm, the measured capacitance can be about 150 fF.

Along these lines, assuming a power supply to the electronic component 514 of about 1.8-Volts, electronic components described herein, such as electronic component 514, can be configured to include a charge of 6840 fC when an object, such as a user's skin, makes contact with back cover 410 or transparent component 412. When the user's skin is at a distance of 5 mm away from back cover 410 and/or transparent component 412, electronic component 514 can be configured to hold a charge of about 1800 fC. In other examples, a distance of 10 mm can correspond to a charge of about 900 fC, a distance of 15 mm can correspond to a charge of about 540 fC, and a distance of 20 mm can correspond to a charge of about 270 fC.

Electronic devices in accordance with those shown in FIG. 10 can take a variety of forms and perform a variety of functions. The features, components, arrangements, configurations, examples, and specific advantages thereof, as described herein with regard to the example of FIG. 10, can, in isolation or in combination with one another, be applicable to, or combined with, any other feature, component, arrangement, configuration, examples, or combinations thereof, including those shown in subsequent or previous figures and described herein.

Figure 11:
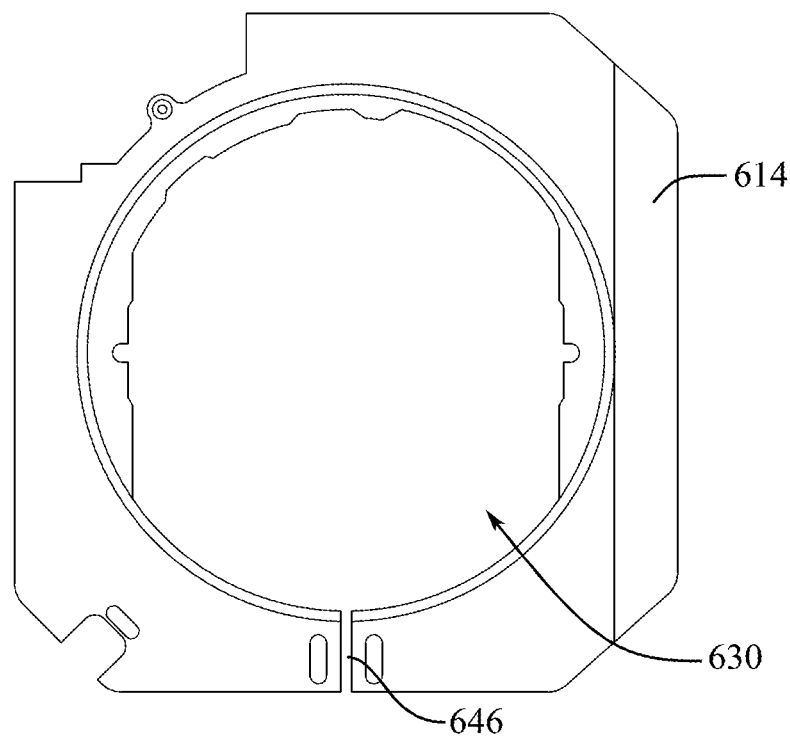
FIG. 11 illustrates an electrical component of an electronic device.

FIG. 11 illustrates another top view of an example of an electronic component 614 configured for use as part of a capacitive proximity sensor, similar to one or more other electronic components described herein. And at least one example, electronic component 614 defines a gap or break 646 that extends through electronic component 614, for example extending from a periphery of electronic component 614 to electronic component aperture 630. Break 646 keeps electronic component 614 from forming a complete ring around electronic component aperture 630. In this way, if an electronic device with electronic component 614 also includes one more components configured for inductive charging or other electrical field generating components, electronic component 614 may not be affected or heated by these other components or the electric fields emanating therefrom.

The example shown in FIG. 11 includes features and elements that can be combined with one or more other devices, components, and examples described herein, in whole or in part, without departing from the advantages or general spirit of examples shown in other figures and described herein.

Figure 12:
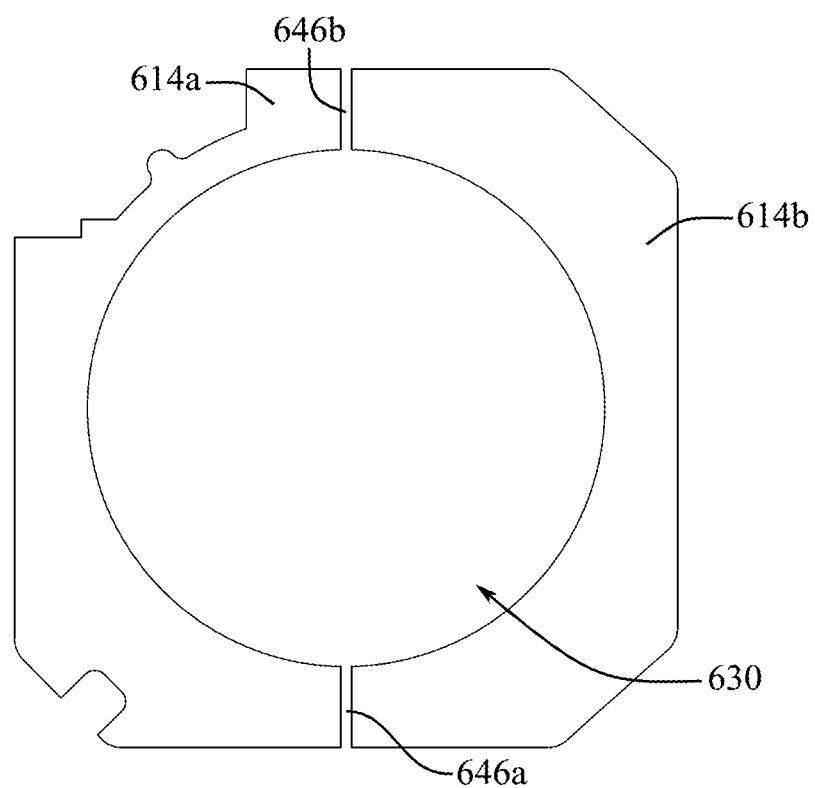
FIG. 12 illustrates an electrical component of an electronic device.

In at least one example, electronic devices described herein can include more than one electronic component 614 configured to be part of a capacitive proximity sensor. For example, FIG. 12 illustrates a dual electrical component configuration including a first electronic component 614a and a second electronic component 614b, which together can at least partially define an electronic component aperture 630. Similar to other electronic components described herein, dual electronic component 614a, 614b can be disposed within an electronic device so that electronic component aperture 630 aligns with, for example is generally concentric with, other apertures, as discussed above to form a combined aperture. Two gaps or breaks 646a, 646b can separate first electronic component 614a from second electronic component 614b so that first electronic component 614a is electrically isolated from second electronic component 614b.

In at least one example, both first and second electronic components 614a, 614b, respectively, can be part of or formed with a single structural member, such as structural member 422 shown in FIG. 8 and others described herein, yet remain separated by breaks 646a, 646b as shown in FIG. 12. In such an example, first and second electronic components 614a, 614b can include electrically conductive materials while the rest of structural member 422 of which they can be a part, includes one or more non-conductive materials. In this way, both first and second electronic components 614a, 614b can be electrically isolated from one another while forming part of the same structural member 422. Alternatively, in at least one example, each of first and second electronic components 614a, 614b can be part of separate structural members 422.

In this way, first electronic component 614a is electronically isolated from second electronic component 614b. As such, this dual configuration can be employed within an electronic device to form at least part of two separate capacitive proximity sensors. That is, first electronic component 614a can be configured two sense an object, such as the skin of a user's body or wrist positioned below first electronic component 614a and electronic component 614b can separately detect a distance from the same or other object situated below second electronic component 614b. This can be advantageous when, for example, an electronic device such as a wristwatch shown and described herein is fitted loosely on a user's wrist so that it is tilted or so that a portion of the back or bottom surface of the device is not in complete contact with the user's body.

In such a case, with a wristwatch at a slant or angle relative to the user's wrist, first electronic component 614a and second electronic component 614b can be disposed at different distances away from the user's body while remaining in the same plane as one another within the device. The different distances of each electronic component 614a, 614b from the body can be extrapolated from the different charge at each electronic component 614a, 614b. Thus, a tilt or inconsistent contact of the device with the user's body can be detected using the two separate capacitive proximity sensors of the two separate electronic components 614a, 614b, respectively. This information can be valuable to inform the functions of other sensors within the device. For example, if the device including the first and second electronic components 614a, 614b were loosely worn so that it was tilted or partially separated from the user's body, other sensors within the device that utilize light transmission or otherwise depend on being in direct contact with the user's body could adapt accordingly.

One or more other examples of electronic devices that include more than two electronic components 614a, 614b, which are configured for capacitive proximity sensing, are explicitly contemplated herein. For example, one or more devices similar to those described herein can include three, four, or more than four electronic components 614 configured for separate capacitive proximity sensing.

In at least one example, structural members described herein and associated electronic components can be electrically isolated from other components of the electronic device of which they are a part. In one example, structural members and associated electronic components described herein and configured for capacitive sensing are electronically isolated from other sensors, antennas, housing components, or other components of the device in which they can be disposed.

Electronic devices in accordance with those shown in FIG. 12 can take a variety of forms and perform a variety of functions. The features, components, arrangements, configurations, examples, and specific advantages thereof, as described herein with regard to the example of FIG. 12, can, in isolation or in combination with one another, be applicable to, or combined with, any other feature, component, arrangement, configuration, examples, or combinations thereof, including those shown in subsequent or previous figures and described herein.

Figure 13:
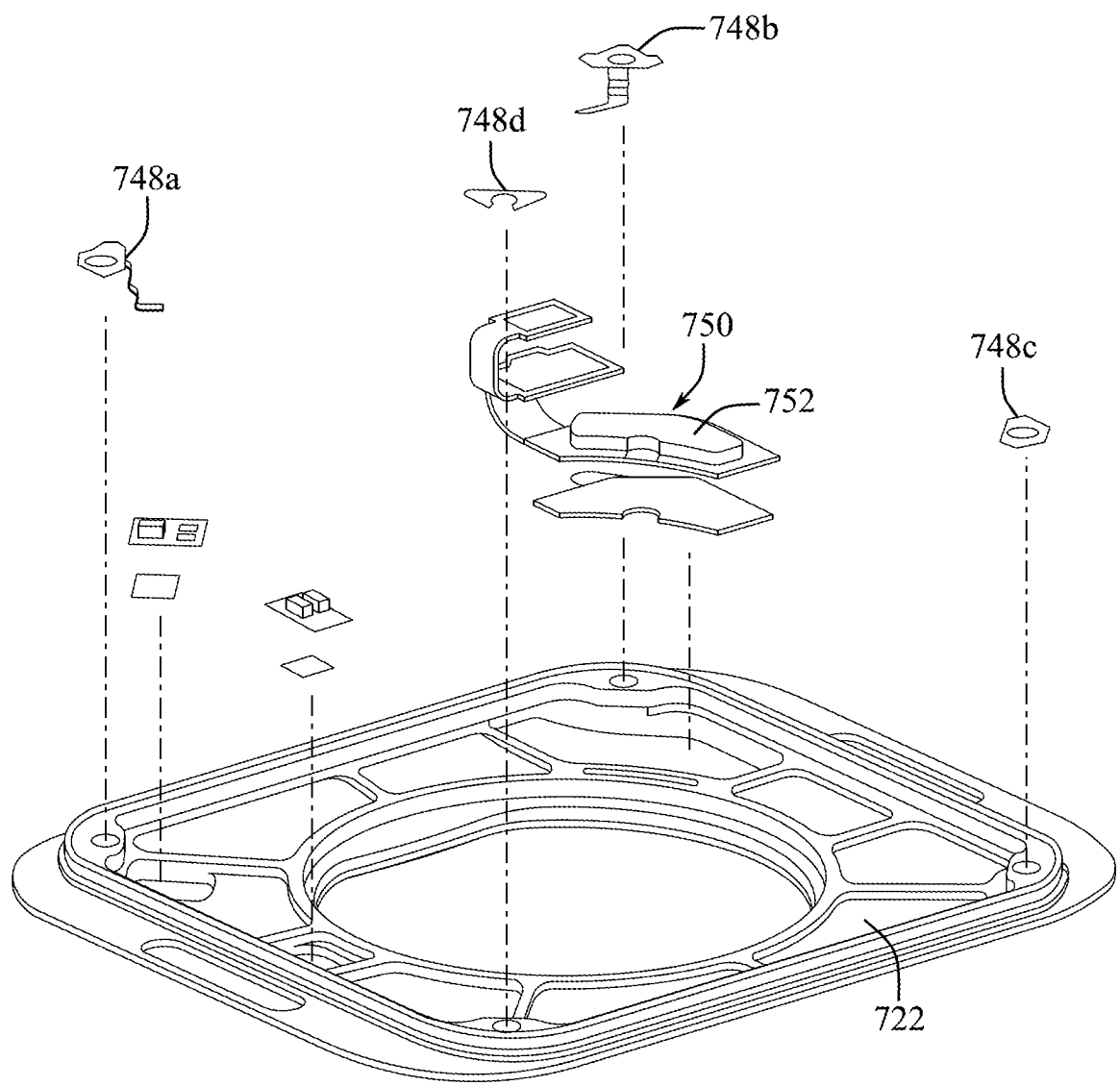
FIG. 13 illustrates an exploded view of a portion of an electronic device.

As noted above, at least one example of an electronic device described herein includes one or more processors and/or sensing circuits electrically coupled to electronic components and/or structural members serving as capacitive sensors. Along these lines, FIG. 13 illustrates and exploded view of a sub assembly 700 of an electronic device, including structural member 722, back cover 710, and a variety of other connection and or electronic coupling components. These other components can include, for example, one or more electrical spring contacts 748a, 748b, 748c, 748d and one or more flex assemblies 750 which can also include one or more sensing circuitry components and or processor assemblies or subassemblies 752. These various spring contacts 748a-d and flex assembly 750 can be disposed within an electronic device to make contact with the electronic component of structural member 722 or other portion of structural member 722 configured to hold or collect electronic charge as part of a capacitive sensor.

Figure 14:
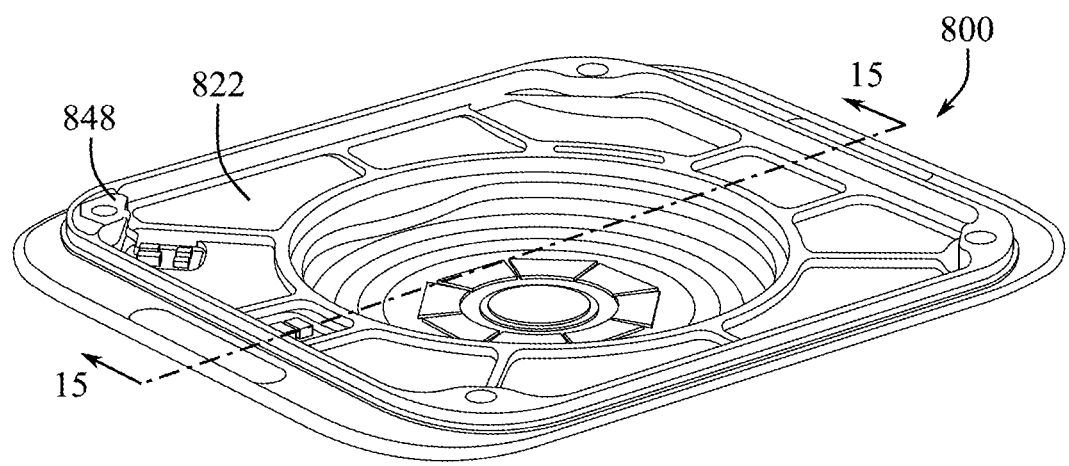
FIG. 14 illustrates a perspective view of a portion of an electronic device.
Figure 15:
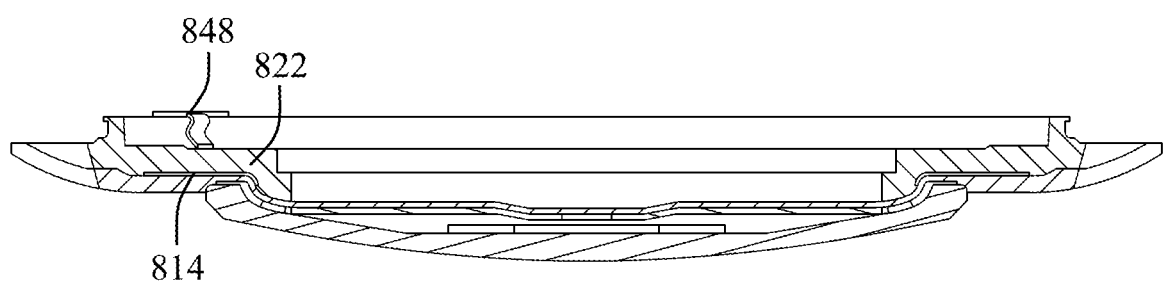
FIG. 15 illustrates a cross-section view of the portion of the electronic device of FIG. 14.

In one particular example of a device sub assembly 800 shown in FIG. 14, an electrically conductive spring contact 848 extends through an opening in structural member 822 to make contact with a lower surface thereof or an electronic component thereof serving as part of the capacitive proximity sensor. Along these lines, FIG. 15 illustrates cross-sectional view of the assembly shown in FIG. 14 where spring contact 848 extends down through structural member 822 to make electrical contact with electronic components 814.

Figure 16:
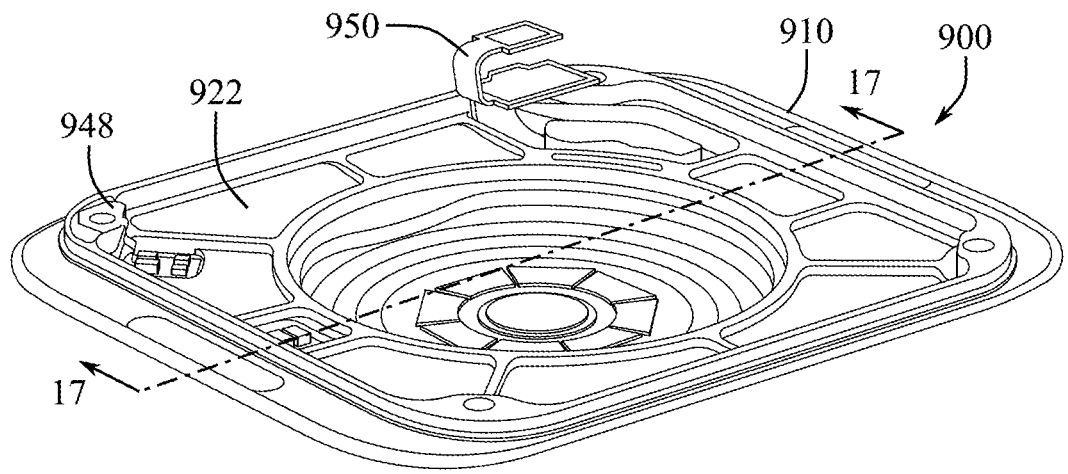
FIG. 16 illustrates a perspective view of a portion of an electronic device.
Figure 17:
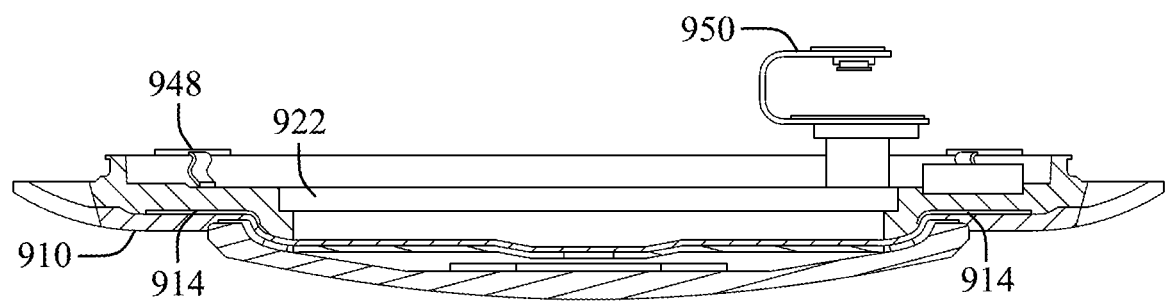
FIG. 17 illustrates a cross-sectional view the portion of the electronic device of FIG. 16.

Similarly, FIG. 16 illustrates a sub assembly 900 that includes a spring contact 948 as well as a flex assembly 950 configured to make electrical contact with an electronic component of structural member 922 coupled with or disposed against back cover 910. FIG. 17 shows a cross-sectional view of sub assembly 900 shown in FIG. 16 to illustrate electronic component 914 sandwiched between structural member 922 and back cover 910. Electrical contact can be made with electronic component 914 via spring contact 948 and/or flex assembly 950 and then coupled with one more sensing circuits and or processors elsewhere in the device.

As illustrated in FIGS. 16 and 17, more than one type of electrical contact can be employed within the device, as part of sub assembly 900, too measure or read the electrical charge of electronic component 914 and communicate to one or more sensor circuits and/or processors. Additionally, or alternatively, electronic component 914, or any other electronic component described herein, which can be configured as part of a capacitive sensor, can also be used as an antenna. In such an example, one electrical contact, such as spring contact 948, can be configured as part of a capacitive sensing module or circuit while a second electrical contact, such as flex assembly 950, can be configured to make contact with electronic component 914 as a part of an antenna module or circuit.

The various examples of electronic devices shown separately in accordance with FIGS. 13-17 can take a variety of forms and perform a variety of functions. The features, components, arrangements, configurations, examples, and specific advantages thereof, as described herein with regard to the separate examples of FIGS. 13-17, can, in isolation or in combination with one another, be applicable to, or combined with, any other feature, component, arrangement, configuration, examples, or combinations thereof, including those shown in subsequent or previous figures and described herein.

One or more additional processors can also be configured within the electronic device to multiplex between multiple functionalities of the various circuitry and contacts coupled with electronic component 914. For example, a central processor or other computing device can switch from receiving an electrical charge measurement from electronic component 914 as part of a capacitive sensor functionality and receiving or sending a radio frequency signal using electronic component 914 as part of an antenna functionality.

Figure 18:
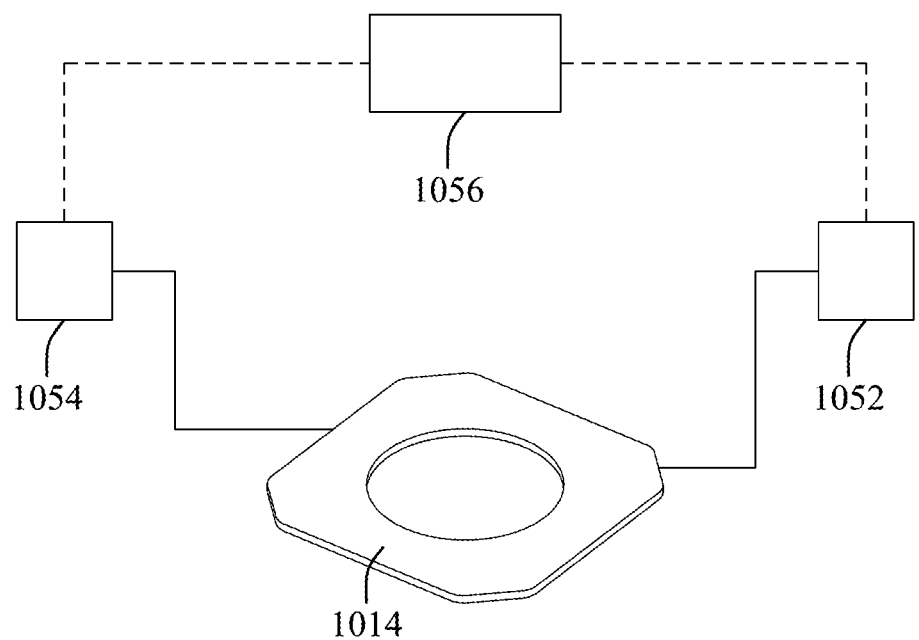
FIG. 18 illustrates a schematic view of a multiplexing electronic component of an electronic device.

To further illustrate an example of this multiplexing of electronic component 914, FIG. 18 illustrates a schematic view of an electronic component 1014, which can be similar to one or more other electronic components described herein, coupled to one or more circuits, processors, electrical contacts, and/or other electronic components configured to perform capacitive sensing or antenna functions using electronic component 1014. In at least one example, an antenna module 1052, which can include one more processors, electrical contacts, or other antenna circuitry, can be electrically coupled to electronic component 1014. Additionally, a separate capacitive proximity sensing module 1054, which can include the same or separate processors, circuitry, and electrical connections as antenna module 1054, can be electrically coupled to electronic component 1014 and configured as part of a capacitive proximity sensing function of electronic component 1014.

In addition, at least one example includes a processor or other central computing module 1056 configured to switch between antenna module 1052 and capacitive proximity sensing module 1054. In practice, switching between modules 1052 and 1054 can occur rapidly so that in practice, electronic component 1014 can serve as an antenna and a capacitor proximity sensor simultaneously from the perspective of the user during use.

Figure 19:
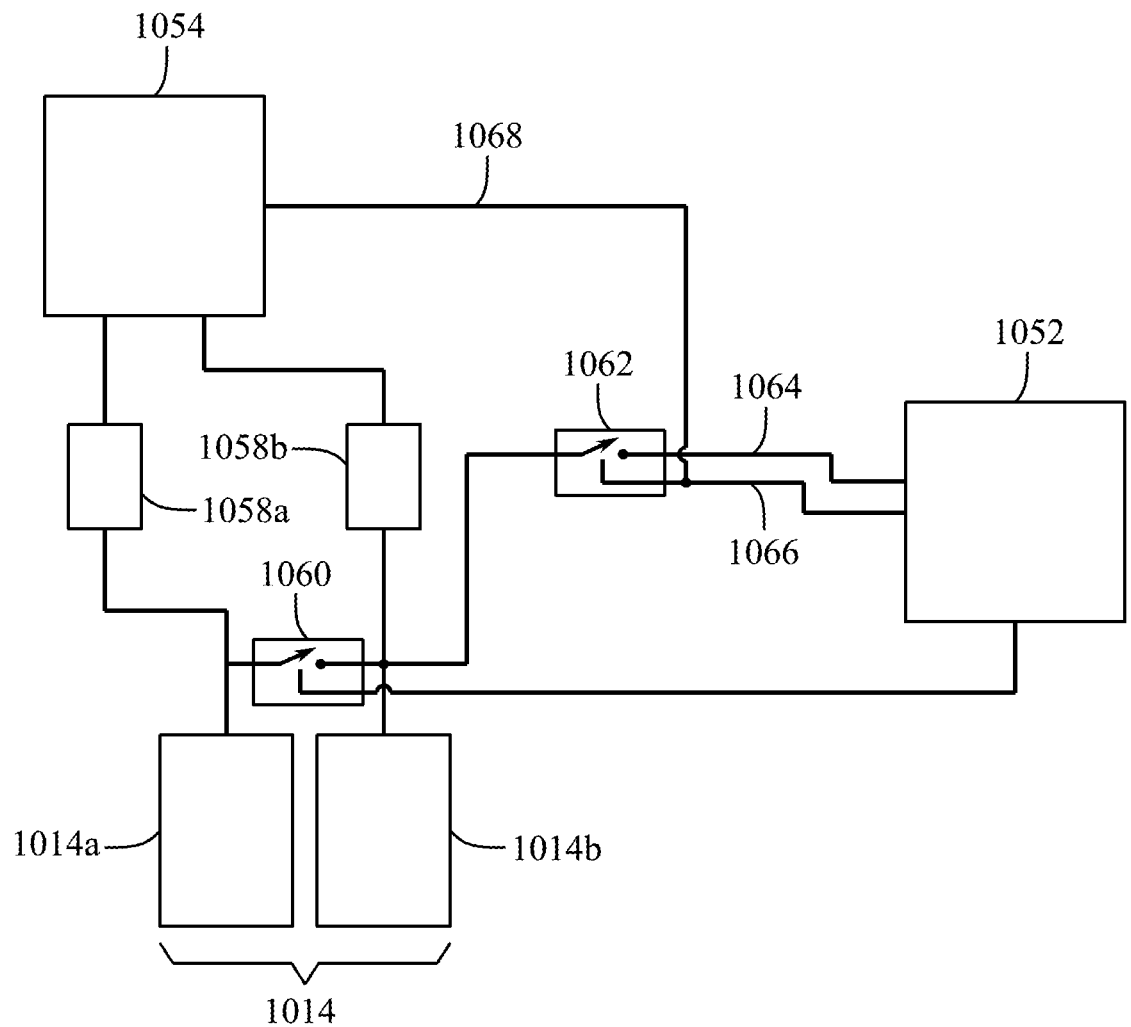
FIG. 19 illustrates a circuit diagram of a multiplexing electronic component of an electronic device.

FIG. 19 illustrates a circuit diagram of another example of a multiplexing electronic component 1014 configured to perform both capacitive sensing and RF antenna functions. In one example, electronic component 1014 can include first and second electronic components 1014a, 1014b, or sub-components, similar to electronic components 614a and 614b shown in FIG. 12. In the illustrated example of FIG. 19, electronic component 1014 can be electrically connected to sensing module 1054 and radio 1052, as shown. The circuit of FIG. 19 also includes RF blocking filters 1058a, 1058b, first RF switch 1060, and second RF switch 1062, with second RF switch 1062 including RF Input/Output Connection/Signal 1064 and Radio/Sense Control 1066 connections to radio 1052. In one example, Radio/Sense Control 1066 can include a coexistence signal connection 1068 between radio 1052 and module 1054. In addition, radio 1052 can include RF front end and transceiver components. In at least one example, RF blocking filters 1058a, 1058b can guard sensing module 1054 from excessive RF voltages generated by radio 1052

While the illustrated example of FIG. 19 illustrates two electronic sub-components 1014a, 1014b as part of a "two-pixel" multiplexing electronic component 1014, one or more other examples can include electronic components 1014 having additional pixels, including three-pixel components, four-pixel components, five-pixel components, or electronic components 1014 having six or more pixels or sub-components, allowing for further functionalities and multiplexing capabilities.

In at least one example, RF blocking filters 1058a, 1058b can guard sensing module 1054 from excessive RF voltages generated by radio 1052. Also, RF blocking filters 1058a, 1058b can protect sensing module 1054 from de-tuning electronic component 1014 and sub-components 1014a, 1014b thereof. In at least one example, first RF switch 1060 can be flipped to combine electronic sub-components 1014a, 1014b to function as a single electronic component 1014, which may be needed for low-band performance. First RF switch 1060 allows first and second electronic components 1014a and 1014b to act as one antenna element (by shorting) or as two separate capacitive sense elements (by opening). Second RF switch 1062 can isolate RF Input/Output 1064 when sensing module 1054 is sensing.

A coexistence signal connection 1068, which can be used for controlling second RF switch 1062, can also be used to coordinate the sensing and RF antenna operation of electronic component 1014. In one example, radio 1052 can control signal connections 1066 and 1068, for example connection 1066 can call out a signal that controls RF switch 1060, and module 1054 can listen when radio 1052 is not receiving/transmitting while scanning. In at least one example, one or more other communication channels may be needed from a processor (not shown) to indicate a system state to the two systems (sensing/RF antenna).

The elements and circuit components of multiplexing electronic component 1014 shown in FIG. 19, including the arrangement thereof, can include other electronic components and arrangements in one or more other examples. The components, configurations, and advantages of multiplexing component 1014 and the system shown in FIG. 19 can be included alone or in any combination with other embodiments of electronic components and associated systems shown in the other figures and described herein. In addition, the components, configuration, and advantages of electronic components and associated systems shown and described with reference to other figures can be included alone or in any combination with electronic component 1014 and associated circuit components shown in FIG. 19 and described herein.

Any number or variety of components in any of the configurations described herein can be included in an electronic device, as described herein. The components can include any combination of the features described herein and can be arranged in any of the various configurations described herein. The structure and arrangement of components of a device, as well as the concepts regarding the use and operation of the components can apply not only to the specific examples discussed herein, but to any number of embodiments in any combination. Various examples of electronic devices and electronic device components including having various features in various arrangements are described below, with reference to FIGS. 3-4.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An electronic device, comprising:
a housing at least partially defining an internal volume;
a front cover connected to the housing, the front cover comprising a touchscreen;
a back cover connected to the housing and disposed opposite the front cover, the back cover defining an exterior surface of the electronic device and an interior surface opposite the exterior surface and defining the internal volume;
a structural member disposed against the interior surface of the back cover and disposed at least partially within the internal volume, the structural member comprising an electronic component disposed between the structural member and the back cover; and
a sensing circuit disposed in the internal volume and electrically coupled to the electronic component, the sensing circuit detecting a charge of the electronic component.

2. The electronic device of claim 1, further comprising a processor disposed within the internal volume, the processor configured to determine a presence of an object near the back cover based at least partially on the charge detected by the sensing circuit.

3. The electronic device of claim 2, wherein the presence of the object is detected when the charge passes a threshold.

4. The electronic device of claim 3, wherein the threshold is passed when a distance between the structural member and the object is 30 mm or less.

5. The electronic device of claim 4, wherein:
the charge is a first charge;
the electronic component is a first electronic component;
the structural member comprises a second electronic component that is electrically isolated from the first electronic component; and
the sensing circuit detects a second charge of the second electronic component.

6. The electronic device of claim 1, wherein:
the back cover defines a back cover aperture; and
the structural member defines a structural member aperture.

7. The electronic device of claim 6, further comprising a transparent component disposed across the back cover aperture, wherein the back cover aperture is at least partially aligned with the structural member aperture.

8. The electronic device of claim 6, further comprising a sensor disposed in the internal volume, the sensor configured to send or receive a signal through the back cover.

\* \* \* \* \*